(12) United States Patent
Wojnarowski et al.

(10) Patent No.: US 6,410,356 B1
(45) Date of Patent: Jun. 25, 2002

(54) SILICON CARBIDE LARGE AREA DEVICE FABRICATION APPARATUS AND METHOD

(75) Inventors: Robert John Wojnarowski, Ballston Lake; Ernest Wayne Balch, Ballston Spa; Leonard Richard Douglas, Burnt Hills, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/520,751

(22) Filed: Mar. 7, 2000

(51) Int. Cl.$^7$ .......................... H01L 21/66; G01R 31/26
(52) U.S. Cl. ........................ 438/15; 438/14; 438/17; 438/125; 438/126; 438/411; 438/619; 438/623
(58) Field of Search .......................... 438/14, 15, 17, 438/619, 623, 44, 125, 126

(56) References Cited

U.S. PATENT DOCUMENTS

| | | | |
|---|---|---|---|
| 4,783,695 A | | 11/1988 | Eichelberger et al. |
| 5,672,546 A | * | 9/1997 | Wojnarowski .............. 437/209 |
| 5,675,310 A | | 10/1997 | Wojnarowski et al. |
| 5,683,928 A | | 11/1997 | Wojnarowski et al. |
| 5,888,884 A | | 3/1999 | Wojnarowski |
| 5,949,133 A | | 9/1999 | Wojnarowski |

OTHER PUBLICATIONS

Yerman et al., A Mosaic to Large Power MOSFET Chips using a Discretionary Interconnection method on the Wafer, High Frequency Power Conversion Conference 1989, May 14–19, 1989, Naples, Fl, 16 pages.*

AJ Yerman, Et Al, "A Mosaic Approach to Large Power MOSFET Chips Using a Discretionary Interconnection Method on the Wafer", Presented at the High Frequency Power Conversion 1989 Conference, May 14–19, 1989, Naples, FL., 16 Pages.

* cited by examiner

Primary Examiner—David L. Talbott
Assistant Examiner—David A. Zarneke

(57) ABSTRACT

A method for interconnecting high-temperature silicon carbide (SiC) devices enables such high-temperature devices to be used in fabricating electronic circuits of significant scale. This method comprises empirically measuring operational characteristics of a plurality of the devices to be interconnected, the operational characteristics comprising devices which are measured to be non-working and devices which are measured to be working; characterizing the operational characteristics in an operational characteristics map; designing interconnection paths between and among the devices that are characterized to be working by the operational characteristics map; and excluding from the interconnection paths, devices that are characterized to be non-working by the operational characteristics map. A preferred embodiment of this method further includes disposing a temporary polymer layer over the devices; forming via holes through the temporary polymer layer, to bonding pads of the devices; applying a current-balancing resistive metal over the temporary polymer layer; establishing connections between the current-balancing resistive metal and the bonding pads; designing the interconnection paths between and among the working devices by patterning the current-balancing resistive metal based on the operational characteristics map; and removing the temporary polymer layer.

17 Claims, 8 Drawing Sheets

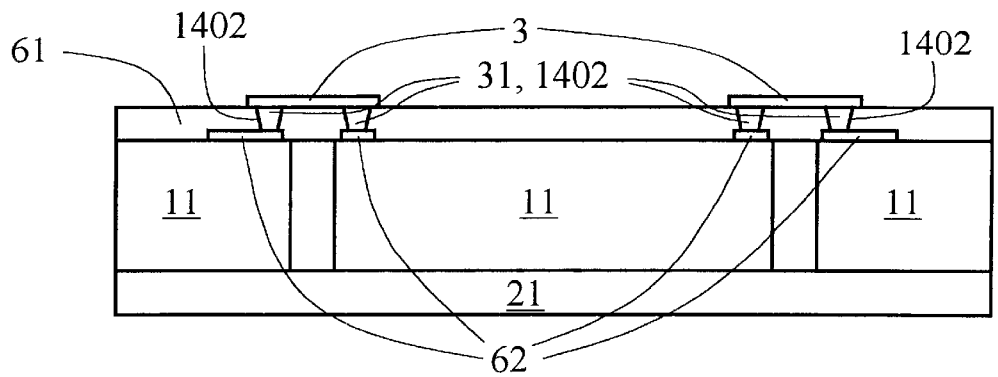
FIG. 6
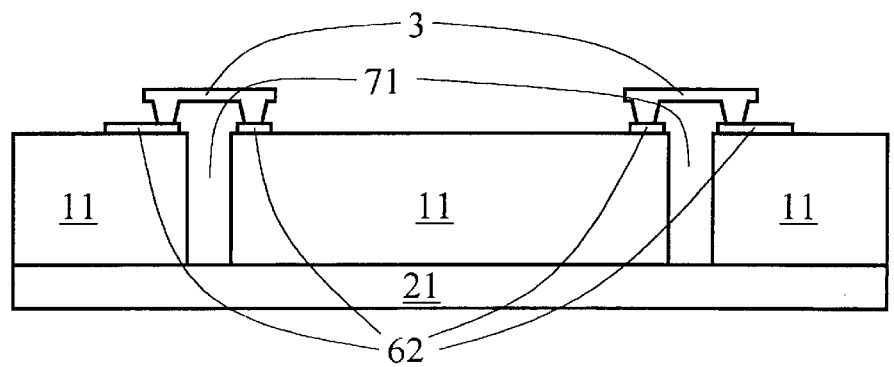
FIG. 7
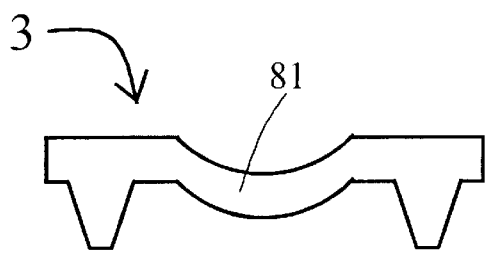   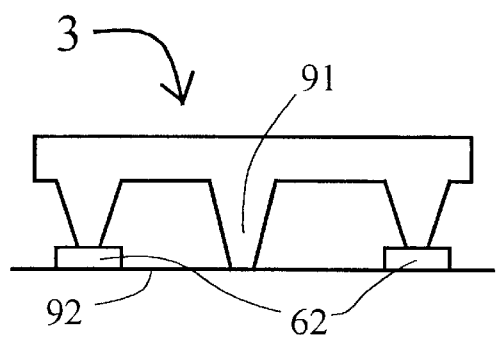
FIG. 8          FIG. 9

SILICON CARBIDE LARGE AREA DEVICE FABRICATION APPARATUS AND METHOD

The invention was made with Government support under contract number MDA972-98-C-0001 awarded by DARPA. The Government has certain rights in the invention.

BACKGROUND OF THE INVENTION

The present invention relates generally to semiconductor packaging.

Semiconductor packaging technologies were designed for the known temperature limits of silicon and gallium arsenide (GaAs) technologies which are near the 125° C. range. These packages are able to use polymer materials and metal interfaces, such as wire bonds, in this range of operation without sustaining heat damage. Current GTO (gate turn off thyristor) packages are a scaling of known technologies, due to the large size of the silicon devices, but they operate within the same temperature limits of silicon-based operation.

It is calculated that silicon carbide (SiC) devices will be as much as 40 times smaller than present-day silicon devices, and will be 2 to 3 times as hot. SiC devices will create a paradigm shift in the packaging and interconnect technologies, because present packaging technologies will be incapable of operation at the higher temperatures. The reduction in size, along with the increase in the voltage handling capability of the SiC material and the much higher temperature range of operation (near 350° C.) demands a fundamental change in the packaging concepts for SiC devices.

Commonly-assigned Wojnarowski, U.S. Pat. Nos. 5,672,546 and 5,949,133 describe a fabrication process that both interconnects semiconductor die efficiently and is capable of withstanding continuous high temperature environments by using a temporary laminate structure with a removable polymer layer to facilitate deposition of metallization patterns and later removing the polymer layer. The packaging approach of these patents is capable of operation for temperatures in excess of 400° C. and can be used to facilitate interfacing of high temperature packaging materials, including metals and ceramics, in a low inductance manner, and of customizing of the coefficients of thermal expansion (CTE) to match the CTE of SiC. The techniques described in these patents are used for high temperature interconnect as well as a high temperature die attach.

SiC devices have several different die sizes and have different power density efficiencies that vary with respect to the device size. FIG. 1, for example, illustrates arrays of small 12, medium 13, and large 14 SiC devices 11 mounted for interconnection on a single substrate, die or wafer. Currently, however, multiple smaller SiC devices 11 on a single die are more efficient than larger SiC devices 11 made on the same die in terms of current handling capacity per area, and it is often desirable to build the approximate functionality of larger devices out of an interconnected plurality of smaller devices on a common substrate die size.

In addition, SiC micro pipe defects currently make it difficult to reliably produce large area devices with good yield and regularity. That is, the fabrication of smaller SiC devices yields a much higher percentage of operational (non-defective) devices than does the fabrication of larger SiC devices. Even the fabrication of smaller SiC devices still yields a significant percentage (approximately 10% to 40%) of defective devices. So, for example, a single pipe defect in a wafer including one large device 14 destroys the whole die or wafer, whereas a similar defect in a small device 12 on a wafer including a plurality of small devices destroys only that device, but saves the overall die and the remaining devices on that die or wafer.

Among non-defective devices, there are also variations in effectiveness. For example, two "theoretically" identical SiC devices 11 may actually vary somewhat with respect to current passing through the devices for a fixed applied voltage. Finally, there are no apparent technology solutions expected to the problem of SiC micro pipe defects, at least over the short term. So any near-term use of SiC technology must have built in from the start, and be based on, the recognition that a fair percentage of the SiC devices 11 produced on any given die, wafer or similar amalgamation of SiC devices 11 will be defective, and that among the working SiC devices 11, operational variations are to be expected.

SiC devices are made by wafer diffusion and/or implantation technology steps. As stated above, due to the immaturity of SiC materials technology and in particular the presence of micro pipe defects, the characteristics of the devices, die and wafers vary from lot to lot, and the devices within a given lot also vary with reference to the current passed through the device, with a fixed voltage applied. Thus "current hogging" similar to that encountered for silicon technology develops wherein some devices run much hotter than associated die, causing hot spots and reliability concerns. The differential current carrying capacity from device to device by lot and wafer, and the resulting temperature variations, cause a long-term reliability concern and pose a serious design and fabrication problem. Die that fail because of shorting cannot be easily dropped from the array of parallel devices, thus destroying the entire array. Additionally, arrays of die or whole wafers of die have intrinsic heat at their centers which is higher than the heat around their edges. Thus, a method is needed to lower the power in critical areas to achieve a uniform heat and reliability model.

Therefore, a novel concept is needed to manage the current to balance the die to die matching problems and deal with the non-working die that are to be expected in any given production lot.

Thus, it is desirable to achieve a method of gang paralleling high temperature devices such as SiC semiconductor devices and associated technologies that will work at and above the 300° C. SiC operating temperature range.

It is also desirable to enable a shorted device to be removed from an active die or wafer array without having to destroy the whole array, preferable in a self-eliminating way requiring no human intervention.

It is also desirable to enable die, small and larger arrays of die, whole wafers, and portions of wafers to be used within a common technology framework. In particular, it is desirable for die from different wafers with different characteristics and sizes to be used within a common package.

SUMMARY OF THE INVENTION

Briefly, according to one embodiment of the present invention, a method for interconnecting high-temperature silicon carbide (SiC) SiC devices includes: empirically measuring operational characteristics of a plurality of said SiC devices to be interconnected. These operational characteristics comprise SiC devices which are measured to be non-working and SiC devices which are measured to be working. The method further includes characterizing these operational characteristics in an operational characteristics map; designing interconnection paths between and among the SiC devices that are characterized to be working by the operational characteristics map; and excluding from these interconnection paths SiC devices that are characterized to be non-working by the operational characteristics map.

Also disclosed is an interconnected die or wafer array apparatus produced by this method.

BRIEF DESCRIPTION OF THE DRAWING

The features of the invention believed to be novel are set forth in the appended claims. The invention, however, together with further objects and advantages thereof, may best be understood by reference to the following description taken in conjunction with the accompanying drawing(s) in which:

FIGS. 6 and 7 are cross-sectional plan views illustrating the metal patterned high temperature structures before and after temporary polymers used in -SiC fabrication are removed.

FIG. 8 is a plan view illustrating a dipped version of the interconnection paths of FIGS. 3, 4 and 5 which introduces a lateral spring-like tension that aids in CTE compensation.

FIG. 9 is a plan view illustrating a support post used to prevent excessive droop in the interconnection paths of FIGS. 3, 4 and 5 due to heating effects.

DETAILED DESCRIPTION OF THE INVENTION

As discussed above, in one embodiment of the present invention, a method for interconnecting high-temperature silicon carbide (SiC) SiC devices 11 on a substrate 1 includes empirically measuring operational characteristics of a plurality of said SiC devices to be interconnected and creating an operational characteristics map therefrom; and designing interconnection paths between and among said SiC devices based on the operational characteristics map, wherein SiC devices that are designated to be non-working according to the operational characteristics map are excluded from interconnection. Substrate 1 may comprise a wafer or die on which all the devices are integrated, or substrate 1 may comprise a support structure on which a plurality of wafers or dies are situated.

Figure 1:
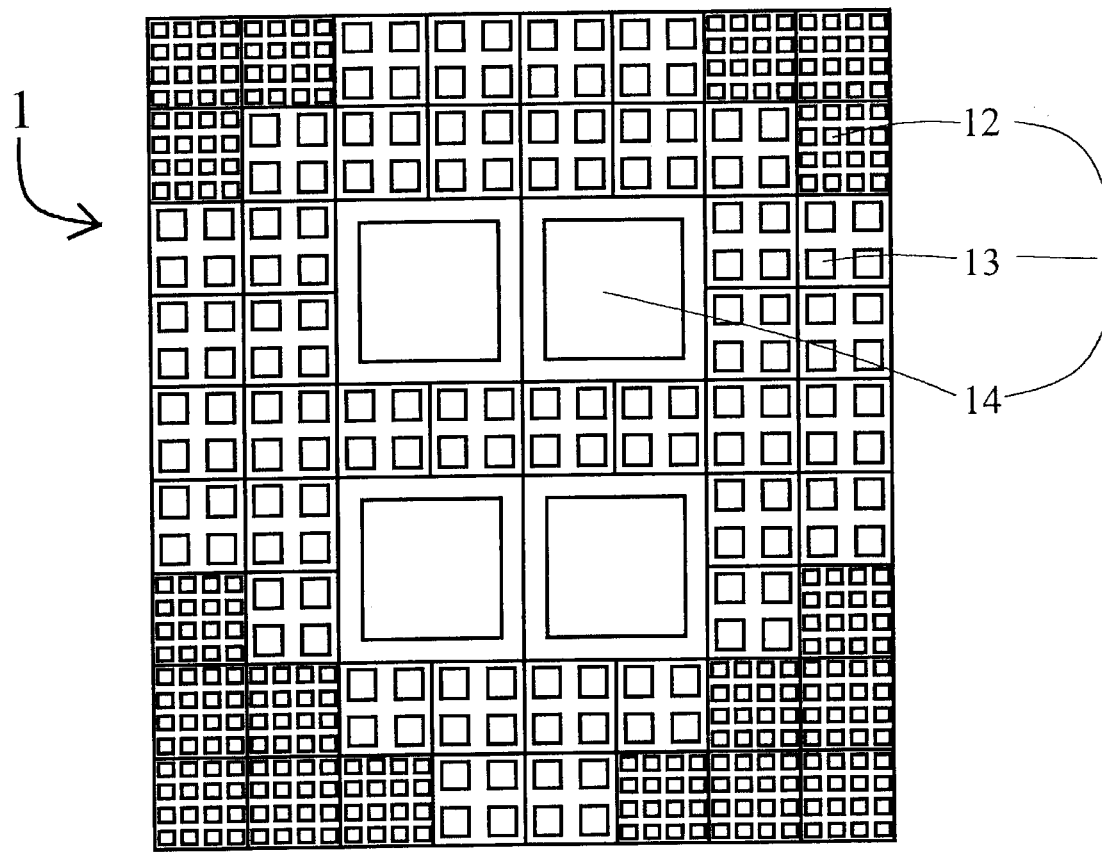
FIG. 1 schematically illustrates SiC devices of several different sizes on a substrate.
Figure 2:
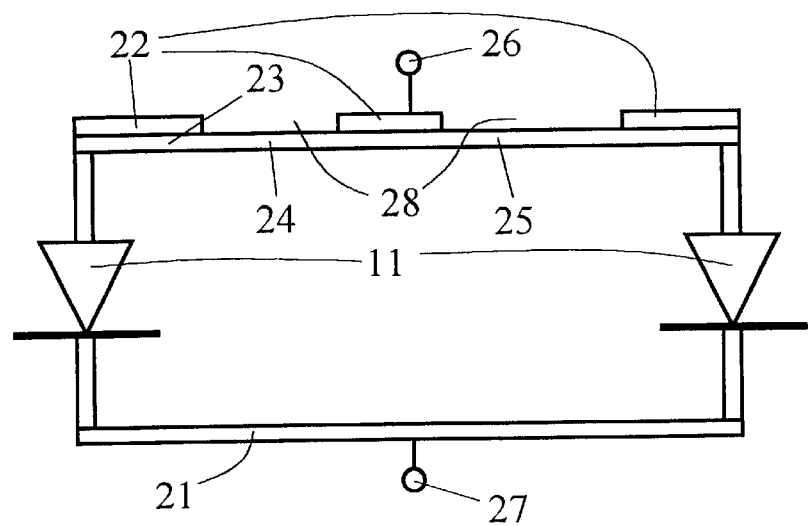
FIG. 2 is a schematic view illustrating two SiC devices with current balancing interconnection paths.

FIG. 2 illustrates two SiC devices 11, in this example diodes, which are understood to possess different operational characteristics due to the aforementioned material variations that affect this presently-immature SiC technology. As understood herein, SiC die may comprise a single SiC device 11, or arrays of diffusions of SiC devices 11 on a single die, or wafer segments. These operational differences are tested and measured. Math calculations are applied using a suitable computer algorithm, and a CAD offset file is generated. This file is used to photopattern resist areas and differentially open varying lengths of resistive openings for current management and device optimization.

In particular, FIG. 2 illustrates a high-temperature die attach metal 21, a high-temperature shunt metal 22 such as gold, and a current-balancing! resistive metal 23 such as nickel chromium (NiCr). It can be appreciated that by removing different amounts of shunt metal 22 and creating notches or cutouts 28 in response to the testing and measuring of operational differences between SiC devices 11, resistance R1 at 24 will be different from resistance R2 at 25. These differing resistances are used to compensate for operational differences between the two SiC devices 11 so as to balance the current flow through each. Also illustrated are anode 26 and cathode 27. These interconnects may have an adhesion layer (not shown) of one metal such as NiCr, in addition to the shunt metal 22.

Voltages are applied and the responses of individual SiC devices 11 are measured. These devices responses are characterized by a mathematical algorithm and devices interconnect sections are photopatterned and etched as notches. This removes the shunt metal 22, and leaves varying resistive sections of different values to average out the currents and temperatures in each SiC devices 11. Photopatterning is also used to entirely bypass non-working SIC devices 11.

In a preferred embodiment, this is achieved by using adaptive lithography to generate a CAD-based offset file to characterize the SiC wafers and arrays of die and devices in an application. In particular, an "operational characteristics map" of the SiC devices 11 is developed for a particular production lot. This map includes a characterization of "good" and "bad" devices, and may also characterize differential operational characteristics (e.g., current and heat for applied voltage) as among "good" devices. As a general design rule, it is also desirable to approximate and make SiC large current devices from smaller devices in a technologically efficient way, thus taking advantage of the fact that smaller SiC devices can be produced with a lower percentage of defects than larger SiC devices.

Figure 3:
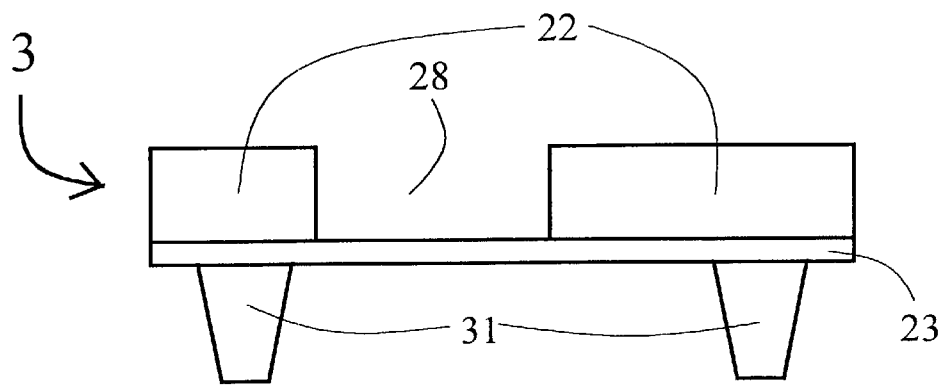
FIG. 3 is a plan view illustrating a notch or cutout in a high-temperature interconnection path to alter the resistance of current-balancing resistive metal in that interconnection path.

FIG. 3 illustrates a basic embodiment of the approach schematically illustrated by FIG. 2. Using a high-temperature metal interconnection path 3, a notch or cutout 28 is opened in high-temperature shunt metal 22, thus altering the resistance of current-balancing resistive metal 23 in the region of notch 28 from what it would be without this cutout 28. Also shown are via connections 31 to the bonding pads 62 (not shown here, but see FIGS. 6 and 7) of SiC devices 11.

As noted above, it is also desirable to provide a method of thermal and current management based on de-tuning the center areas of large arrays or wafers due to thermal runaway. As discussed below, this may be done, for example, by using resistor temperature devices, fusible links to eliminate undesired devices, and/or using increased resistor values in different sections of very large arrays to reduce current and therefore keep an even temperature of operation across the array.

Figure 4:
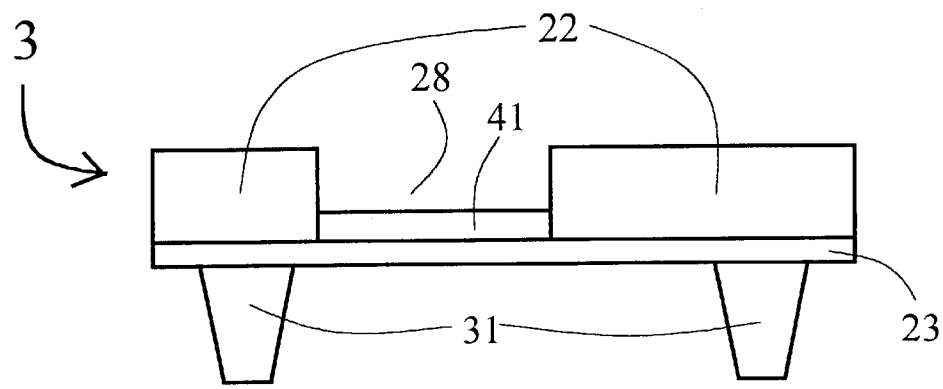
FIG. 4 is a plan view illustrating the insertion of a resistor temperature device into the notch or cutout of FIG. 3, thereby allowing the resistance across the interconnection path to vary with temperature so as to self-limit current to failing or current-hogging devices.

FIG. 4 illustrates the use of RTDs (resistor temperature devices) which increase resistance and hence limit current as temperature rises, to aid in such current balancing for high-temperature SiC devices. This allows the resistance value to change and thereby limit current as these devices increase in temperature, thus raising the feasible operating temperatures for SiC devices. In particular, a resistor temperature device 41 may optionally may be positioned in notch 28, thereby causing the resistance between via connections 31 to vary with temperature. This enables the circuit to self-limit current to failing or current-hogging devices. Electrical current is thus managed by these inserted resistor temperature devices 41, wherever the aforementioned measurements and characterizations (operational characteristic map) demand, to resolve the differential current hogging potential due to bad, or different, characteristic devices.

Figure 5:
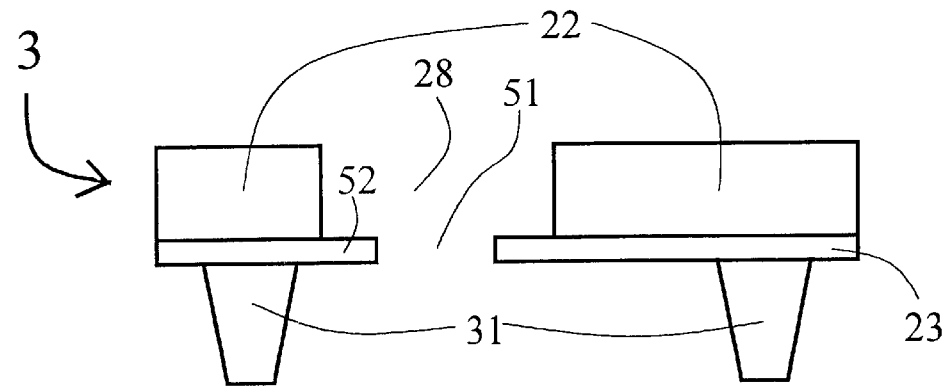
FIG. 5 is a plan view illustrating the interconnection path embodiment of FIG. 3 employing a fuse link.

FIG. 5 illustrates another embodiment using a fuse link 52 involving the same resistor segments described in FIG. 3, to electrically eliminate failed or undesired components, such as devices or sections of wafers, without losing the entire assembly. In this embodiment, currents that are too high will automatically create a fuse opening 51 in interconnection path 3, thereby removing the undesired or shunted components. As with any fuse, this link is fabricated with a metal that will melt when a predetermined current threshold is exceeded. Particularly, in a large area wafer all die may not be able to be used as the temperatures may not be easily managed. As a result, resistor areas may need to be increased or eliminated in center areas, which tend toward higher heat as noted above.

To summarize, in the embodiments of FIGS. 2, 3, 4 and 5, shunt metal 22 is employed where feasible to enhance the current carrying capacity of the overlay metalization. This enhanced metal structure shunts the underlying resistor/interface/barrier metal(s), and enables resistors of adaptive length to be formed merely by selectively removing small sections of shunt metal 22 revealing the underlying current balancing resistive metal 23 of FIGS. 2, 3, 4 and 5. The selective removal of shunt metal 22, as well as the placement of any necessary resistor temperature devices 41 or fuse links 52 is determined based on the measured operational characteristics of the SiC devices 11.

It is desirable to use metal SiC bonding pads 62 that may be made of matching, non-oxidizing, high-temperature metals such as molybdenum, tungsten etc., to prevent a high temperature corrosion effect and an inherent galvanic action produced between dissimilar (non-matching) metals. For example non-matching gold pads and nickel form a 1.75V DC battery. Some of these metal batteries are not well characterized at high temperatures. Therefore, being able to use matching metals which will not form a battery prevents this failure mechanism. To achieve this, non-wire bonding methods are used.

FIGS. 6 and 7 illustrate the interconnection path 3 of FIGS. 3, 4 and 5 in relation to SIC devices 11 and their contact bonding pads 62. It can thus be appreciated how the notching of FIG. 3, as well as the use of resistor temperature devices in FIG. 4 and the use of fuse links in FIG. 5 can serve to modify the current flows between and among SiC devices 11, in the manner that was schematically suggested by FIG. 2.

Additionally, in the embodiment of FIG. 6, high temperature die attach material 21 and a temporary polymer 61 laminate structure is disposed over the high temperature devices 11 and high temperature package such as BEO etc., using HDI (high density interconnect) process technology, but with high temperature metal variants. FIG. 7 illustrates the embodiment of FIG. 6, after temporary polymer 61 has been removed.

Referring to FIG. 6, via holes 1402 are formed using laser technology. High temperature non-oxidizing metals, such as tungsten, molybdenum, gold, platinum, palladium, rhodium, nickel chromium, titanium tungsten, etc., are applied over the desired areas as metal 23 (shown in FIGS. 2–5), and photo-patterned and etched open by chemical etches etc., to provide the selective interconnection of high temperature devices, and the packaging structure, based on the aforementioned operational characteristics map. The metal system is a sputtered interface metal to the SiC device such as titanium, titanium tungsten, nickel chromium, tantalum nitride ($Ta_2N$), and the like. It is desired to have an interface metal that may also function as a resistor material, for current balancing between SiC devices. This is easily accomplished by making algorithm based, adaptive openings in overplated shunt metal 22 (shown in FIGS. 2–5) runs, in a one step trimming process of tantalum nitride resistor developments, as disclosed in aforementioned U.S. Pat. Nos. 5,675,310 and 5,683,928. This enables a direct method to control current hogging of single SiC devices 11, or die with multiple SiC devices 11.

The preform or electroplating metal is deposited over temporary polymer 61, photopatterned, and etched open by chemical etches etc., using the CAD offset file (operational characteristics map) which uses the operational test data and device characteristics of the SiC devices 11 being interconnected to specify optimum interconnects and properties for these interconnects.

After this SiC devices or array characterization, and after current trim balancing using the aforementioned computer algorithm, all temporary polymeric materials 61 are removed prior to seal, by simple solvent soaks and polymer strippers, resulting in the configuration of FIG. 7. The result is that after removal of temporary polymer 61, all necessary interconnection paths 3 connecting contact bonding pads 62 of SIC devices 11 will be fully formed and in place. By virtue of the control of the deposition and etching process by the computer algorithm based on empirical test data of the SiC devices 11, these interconnection paths 3 will have the adaptive current limiting options specified in FIGS. 3, 4 and 5 already fully integrated therein, as appropriate for each such interconnection. If polymer layer 61 comprises a high temperature polyimide, the temperature may be extended to near 250° C., thus enabling many areas of learning for SiC device and packaging characterization to take place prior to removing the polymer. Design of the die placement so as to include a moat 71 between devices 11 and beneath interconnection paths 3 further assists in managing (and in this case dissipating) heat. Moat 71 may extend partially or completely through the substrate.

In one embodiment, the moats are formed by sawing up a wafer or die and attaching the sawed portions to a support surface (such as shown by die attach metal 21 in FIGS. 6 and 7) in a spaced apart manner. This embodiment is useful because large wafers can result in CTE matching problems with packaging materials.

Optimally, some of these interconnection paths 3 have an "S" shape or a dipped section 81 in the center to aid in CTE compensation interface options, as illustrated in FIG. 8. This dip 81 is used for CTE stress management during high temperature operation, such as disclosed in U.S. Pat. Nos. 5,672,546 and 5,949,133. Also as disclosed in these patents, other interconnection paths 3 may utilize a support post 91 supported upon substrate surface 92 to prevent excessive droop in interconnection path 3 in long lines in operation, such as is illustrated in FIG. 9. This embodiment is used in situations where interconnection paths need to be particularly long. Droop due to heating effects may be controlled to prevent shorting etc., by this technique. This also allows longer runs to be mechanically managed in high force environments, by enhancing structural stability.

Figure 10:
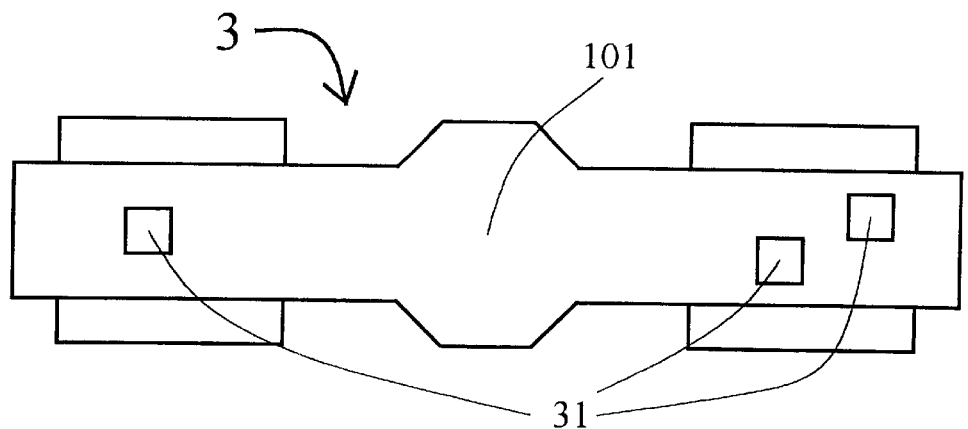
FIG. 10 is a top view illustrating an embodiment having an interconnection path of varying width.
Figure 11:
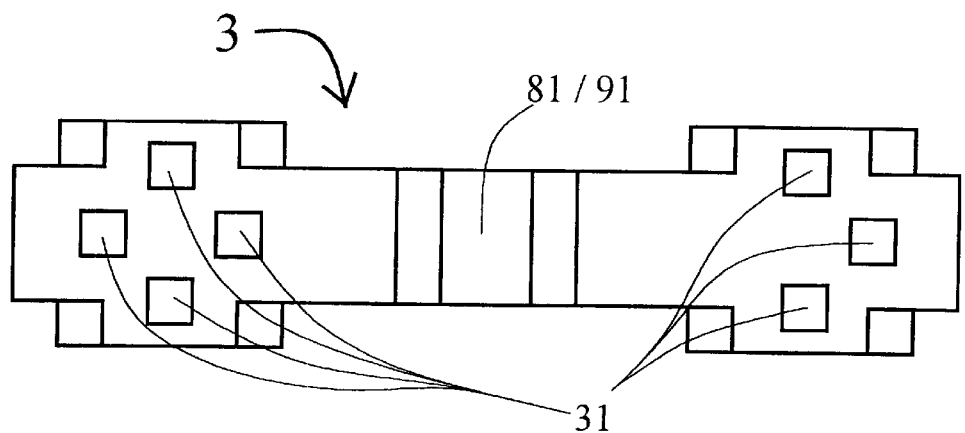
FIG. 11 is a top view illustrating an embodiment including multiple via connections.

FIGS. 10 and 11 depict options for the pad interconnect via connections including patterning variations for performance optimization. FIG. 10 illustrates how varying the width 101 of a interconnection path 3 in accordance with the mechanical, electrical, and temperature characteristics of the SiC devices being interconnected provides yet another way to balance and control current flow and hence other electrical and heat parameters. Thus, the computerized algorithm in this instance specifies such width variations wherever that is the appropriate way to balance current in a given interconnect situations. As shown in FIG. 11, multiple via connections add strength and higher current capacity to the high temperature interconnect while simultaneously minimizing the CTE issues. FIG. 11 also illustrates from another view, how the dip 81 of FIG. 8 and/or the support post 91 of FIG. 9 may also be included, again, whenever the computer algorithm determines that these are appropriate.

Figure 12:
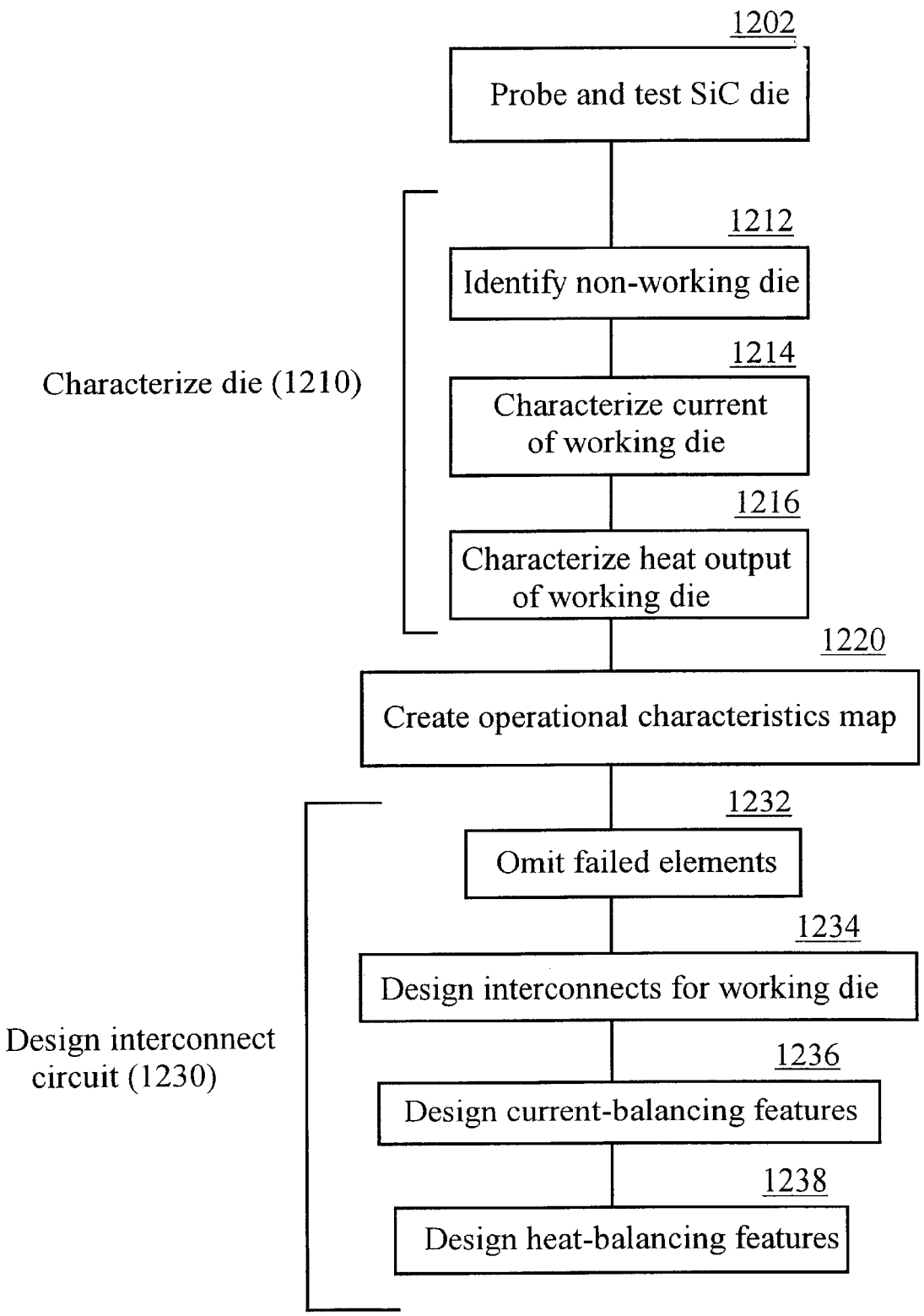
FIG. 12 is a flowchart illustrating an example computer algorithm by which SiC devices are empirically measured, and the design of interconnection paths between and among the SiC devices based on these measurements.

FIG. 12 is a flowchart illustrating the process, e.g., computer algorithm embodied in a computerized device, by which SiC devices 11 are probed and tested 1202, and then are characterized 1210 to identify non-working devices 1212, and among working devices 11, to capture current flow 1214 and heat output 1216. It further illustrates how these results are stored in, e.g., a suitable CAD offset file comprising said operational characteristics map 1220. The operational characteristics map 1220, preferably generated by and stored in the computerized device in response to characterizations 1210, captures which SiC devices 11 are working and which are defective 1212. It also captures important characteristics such as current flow 1214 for a given voltage, and heat output 1216, of each elemental device. Optionally, overall heat output from among clusters of a plurality of SiC devices 11, as well as individual devices, may also be captured. This is helpful, for example, in mitigating heat buildup toward the centers of die or device clusters.

Based on these tests, the underlying computer algorithm next designs a suitable interconnect circuit 1230. This circuit is designed so that SiC devices 11 which are failed are entirely omitted from interconnection with any other devices 1232. (Recall the 10%–40% defect rate noted earlier for even the smallest SiC devices 11.) It also calculates and plots out a suitable set of interconnection pathways 1234 for those SiC devices 11 which are working properly. Finally, based on the measurements taken of the working SiC devices 11, and particularly based on operational variations uncovered between "theoretically" identical SiC devices 11 (again, these variations are due to the immaturity of the SiC materials technology, and the fact that even "good" SiC devices may have operational characteristics that differ from one another), it also designs current-balancing 1236 and heat-balancing 1238 features such as how much metal to remove or trim along the various interconnect paths (FIGS. 2 and 3), where to insert resistor temperature devices (FIG. 4), where to insert fuse links (FIG. 5), where dips (FIG. 8) or posts (FIG. 9) might be needed, how wide to make the interconnection paths (FIG. 10), and/or where multiple via connections might be useful (FIG. 11), for example.

In sum, the goal of the computer algorithm of FIG. 12 is to properly design the interconnection paths between and among SiC devices 11, and the detailed characteristics of these paths, in such a way that currents are properly balanced so as to make the heat distribution as uniform as possible throughout the pertinent wafer or similar amalgamation of SiC devices 11. This algorithm is employed for each and every distinct wafer or similar lot being produced, since the interconnection paths which it designs are based on the operational characteristics of each and every SiC device 11 in that lot, and since these operational characteristics will and do clearly vary from lot to lot due to the immaturity of SiC materials technology. If the technology of SiC devices were to become more reliable such that each SiC device 11 could be reliably produced with uniformity, this would be unnecessary. But at present, and for the foreseeable future, SiC devices will continue to be unpredictable, and so their interconnections are best managed based on the empirical information represented in the operational characteristics map 1220, rather than on a theoretical assumption that all of these devices can be made with some uniformity and reliability (which they cannot). In short, this is a customized, rather than a "one size fits all" interconnection approach.

Returning to FIG. 6, after temporary polymer 61 is removed, the resulting wafer 1 or similar amalgamation of SiC devices 11 operates at high temperature and high current. It is optimally patterned, current balanced, capable of fusible decoupling of a bad or current hogging device, and contains resistor temperature devices as appropriate. The metal interconnects are based on an interconnection path that is non-wire bond based, low inductance, highly reliable, electrically insulated, non-arcing, and stress relieved over the wide range of SiC operational parameters.

An important benefit of this process is that it allows the use of non-aluminum device bonding pads 62 such as molybdenum, platinum, rhodium, palladium, gold, NiCr, tungsten, titanium tungsten (TiW), etc., that are easily interfaced by this novel approach, and which cannot be used as for die bonding using any other known method. These device structures, i.e., bonding pads 62 may be backside attached to the package by a metalizing technology similar to that disclosed in U.S. Pat. No. 5,672,546, that will operate at temperatures in excess of 400° C., without subjecting the package or devices to high temperature brazing and high temperature fluxing operations. This is a real technology problem in that the high temperature solders do not operate at high enough temperature. Gold germanium (AuGe), gold tin (AuSn), and gold indium (AuIn), solders will not perform at 350° C. and will not withstand high vibration. This is because the melting points of these silicon die attach metals commonly used for bonding are too low, allowing the die to side, slip and move during vibration and shock.

U.S. Pat. No. 5,672,546 illustrates a novel approach to a high temperature die attach for this paradigm change with the SiC technology. The die attach is not soldered etc., but is formed in the packaging assembly process by sputtering and electroplating. This approach eliminates a major problem in this high temperature die attach technology. The disclosed backside die attach interface may be locally customized to allow variations of CTE within a common package, to accommodate differing device or component requirements, sizes, or arrays. Designing the die layout to include moat regions 71, as noted in FIG. 7, also assists in heat management and avoiding slippage.

SiC devices and device feedback diodes may be paralleled to increase the current capacity of a common module, thus enabling the scaling of SiC based GTO-like structures to match present non-SiC devices. As the SiC technology matures, it will become possible to produce larger devices, without a re-make of the technology. This building block approach to device scaling by array packaging is integral to SiC developments and use.

The electrical system components may also be partitioned into different packages where the associated components may be incapable of withstanding the high temperature ambient exposure of the SiC devices. This may be done to facilitate the system to site of use to shorten the testing and development cycle.

Additional thermal management is provided, where necessary, by interfacing the module to heat sinking areas in different ways based on application and device size or array size. FIGS. 13–16 illustrate further heat management options for SiC circuit fabrication.

Figure 13:
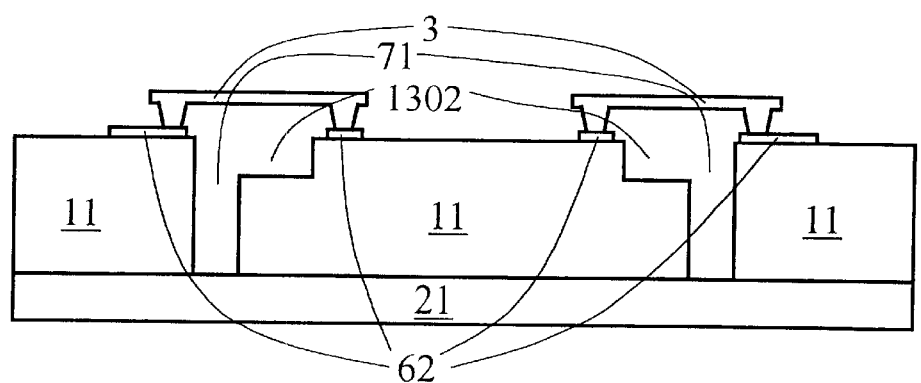
FIG. 13 is a plan view illustrating the use of a segmented heat sink for further use in SiC circuit fabrication.

In FIG. 13, a segmented heat sink may be embodied by using SiC die comprising die edge segments 1302 as shown. This expands the exposed surface area proximate moat 71 to facilitate heat dissipation. Additionally, die attach metal 21 may be fabricated from a material with enhanced thermal conductivity properties, such as molybdenum or tungsten, to further draw heat away from SiC devices 11 as required. A segmented heat sink and package approach can be used in addition to or instead of wafer dicing. This whole wafer approach enables ease of processing and a fast track device characterization process, during the probing after deposition, enabling enhanced packaging options. This segmented heat sink breaks up the accumulative linear stress build up and minimizes differential CTE issues. This is a unique solution to a difficult problem with this packaging paradigm shift. Whole wafers may be probed and characterized using this approach. It also may be used in actual operation with various forms of cooling including air, liquid, and phase change.

Figure 14:
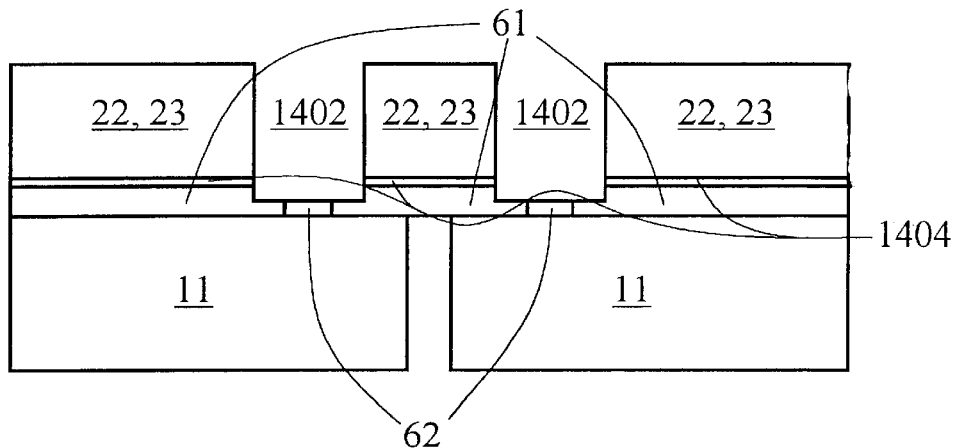
FIGS. 14 through 16 are plan views illustrating an alternative embodiment for employing the techniques of FIGS. 1 through 13.
Figure 15:
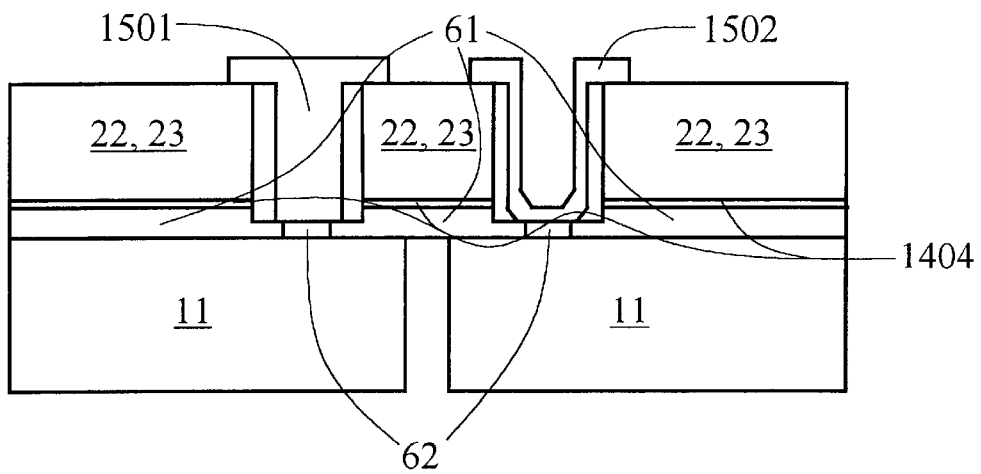
Figure 16:
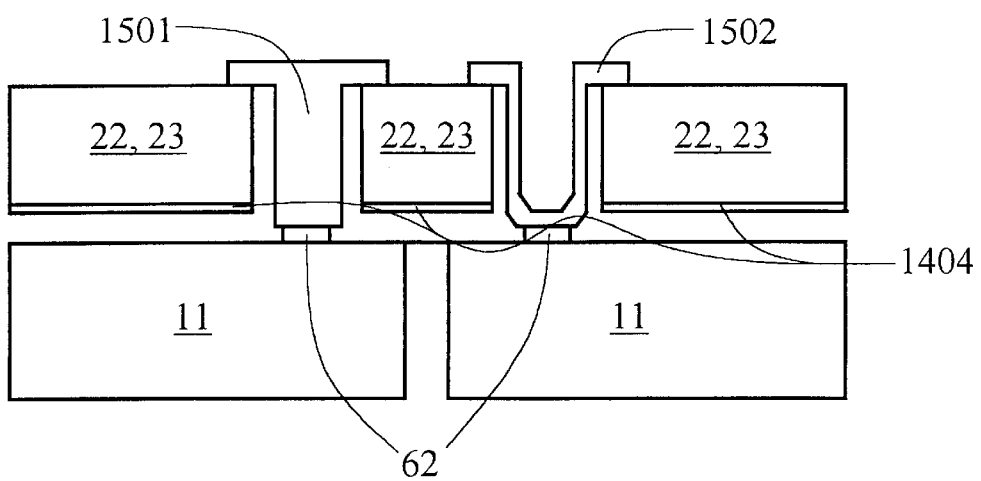

FIGS. 14–16 illustrate an alternative embodiment in which high-temperature shunt metal 22, and current-balancing resistive metal 23 are suitably incorporated into a metal perform layer, employing the current-balancing and heat-balancing techniques previously described in connection with FIGS. 2 through 11 and 13 such as trimming (FIGS. 2 and 3), resistance temperature device insertion (FIG. 4), fuse linking (FIG. 5), dipping (FIG. 8), posting (FIG. 9), width adjustment (FIG. 10), use of multiple via connections (FIG. 11), and use of segmented heat sinks (FIG. 13). These techniques are employed as appropriate in response to the testing and characterization of SiC devices 11 and the design of the interconnect circuit, using the computerized algorithm of FIG. 12.

First, as illustrated in FIG. 14, the metal preform layer comprising shunt metal 22, resistive metal 23, and other necessary elements from FIGS. 2 through 11 and 13 is fabricated atop the layer comprising temporary polymer 61, with an optional intervening inorganic insulator layer 1404. (This inorganic insulator layer 1404 may also optionally be employed in the embodiments of, e.g., FIGS. 6 and 7).

In one example, temporary polymer 61 overlay is applied to the SiC devices 11. A pre-made high voltage, high current, non-oxidizing, low inductance, power overlay structure comprising metal preform layer is attached to the temporary polymer, which is placed over the SiC devices, die, components, and package. A separate pre-made structure is used, as opposed to an HDI structure. Via holes 1402 are extended into temporary polymer overlay 61 using the pre-made holes in the metal overlay as a mask for laser or RIE processing, thus removing the temporary polymer exposing the metal contact pads of the die and package.

At this point, as illustrated in FIG. 15, with the metal preform layer fully in place, it is necessary simply to connect die attach pads 62 to this preform layer. Two candidate die-pad-to-preform connection structures suitable for this purpose are brazed plugs 1501 and welded straps 1502. Of course, other suitable die-pad-to-preform connection structures may also be apparent to someone of ordinary skill within the scope of this disclosure and its associated claims.

As illustrated in FIG. 16, once these die-pad-to-preform connection structures are in place, the temporary polymer 61 is removed, and the result is a perform structure that "floats" above the die or device structures, and which is connected to the die or device structures using as via connections, the aforementioned die-pad-to-preform connection structures such as brazed plugs 1501 and welded straps 1502. Of course, dips and posts as in FIGS. 8 and 9 may be employed for added structural support. Insulator layer 1404 further protects the floating perform structure from heat generated by the die and provides a channel which can again be cooled using various forms of cooling including air, liquid, and phase change.

The process of FIGS. 14–16 is ideal for paralleling of multiple SiC devices or wafers for current scaling to make high current modules from lower current devices. The current hogging management and temperature balancing concepts of FIGS. 2 through 13, as disclosed herein, are again integral to this approach. In this process, metal is pre-processed and high current via metal is applied to the SiC array, thus interconnecting the desired via connections to their components. The temporary polymer materials are removed from the package assembly. High voltage leads and other wire interconnects are attached, placed in a high temperature package. The SiC devices 11 are then tested, characterized and sealed.

Figure 17:
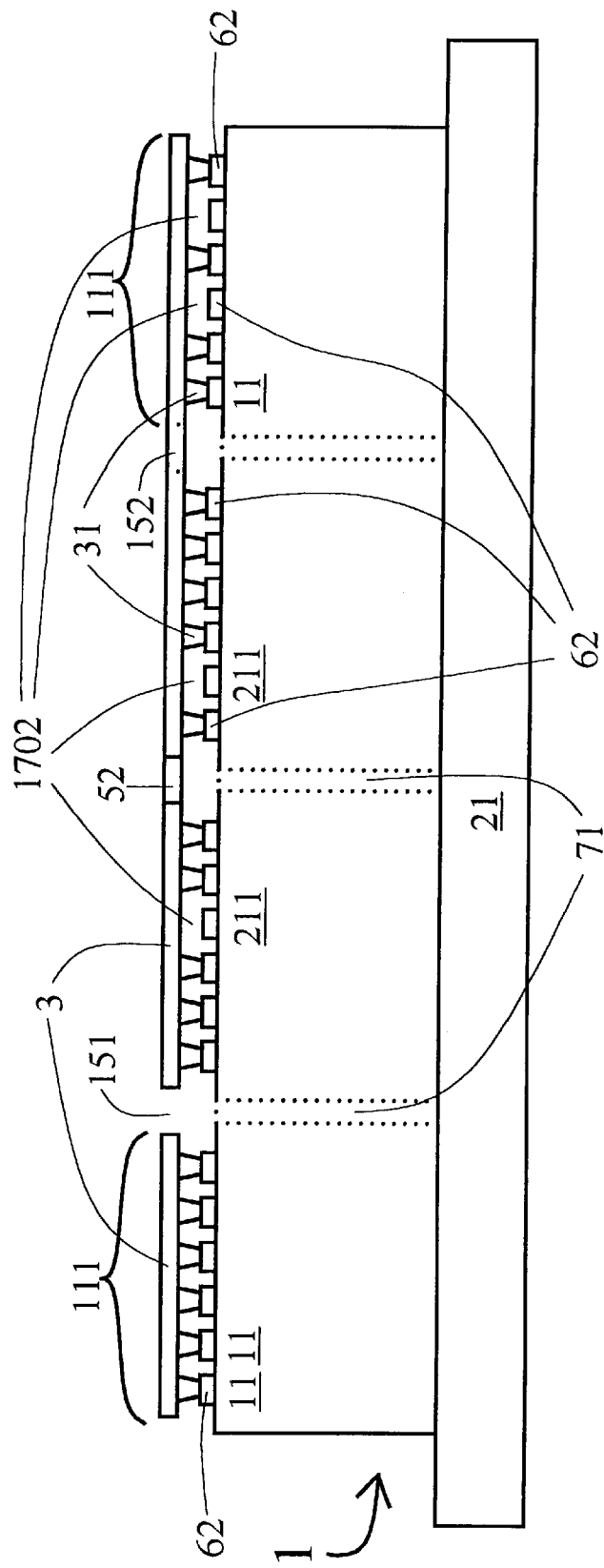
FIG. 17 is a plan view illustrating the elimination of SIC devices which are tested and found to be inoperative from arrays of small devices that can be interconnected to operate as larger devices.

While it is understood that the packaging approaches outlined above apply generally to SiC circuits among a large plurality of SiC devices 11, most of the figures thus far (e.g., FIGS. 2–9, 13–16) illustrate via connections 31 and interconnection paths 3 involving a pair of SiC devices 11. FIG. 17 illustrates this packaging approach more generally, involving multiple connections among multiple SiC devices 11.

As discussed above, multiple diffusions (shown as devices 11) on a single die or wafer can be categorized as working or non-working. Multiple groups of small devices can be interconnected to form integrated larger devices 111. These integrated devices can also be characterized as working or non-working.

In the example of FIG. 17, a high-temperature circuit apparatus includes high-temperature silicon carbide (Sic) segments 111 each comprising a plurality smaller high-temperature silicon carbide devices 11 including working and non-working devices. Interconnection paths 3 interconnect the working devices and exclude the non-working devices 211 in accordance with an operational characteristics map such that each segment operates as an integrated device. The interconnection paths include a current-balancing resistive metal 23 and via connections 31 between the current-balancing resistive metal and bonding pads 62 of the smaller devices. Each of the embodiments discussed above with respect to FIGS. 2–16 can be applied to the embodiment of FIG. 17 as well.

For example, dashed lines represent moats 71 that are optionally present between segments 111. Segments 111 can be interconnected as shown by optional connection 152 and fuse link 52, or segments 111 can be separated as shown by separation 151.

Each such segment comprises a number of SiC devices 11, which is denoted by the plurality of reference numbers for these SiC devices 11 shown on each such segment. Interconnection path 3 generalizes here to the overall interconnect circuit among the various SIC devices 11, which in one embodiment comprises a patterned solder plate produced by the techniques earlier discussed in connection with FIGS. 6 and 7.

As discussed earlier, each SiC device is tested and characterized, resulting in an operational characteristics map which then controls the design of the interconnection paths 3, as discussed extensively in connection with FIGS. 2–16. Those SiC devices 11 which are found to be non-working are omitted from the circuit 3, as shown by the absence 1702 of a via connection 31 in several locations of FIG. 17. Die which are working and therefor interconnected are current and heat balanced by designing the interconnected circuit using the various techniques heretofore discussed throughout this disclosure. By using fuse links 52 (see also FIG. 5) at appropriate points in the interconnect circuit 3, and by also fabricating via connections 31 as fuse links 52 from a suitable fusible material, the overall circuit can self-regulate by dropping out non-working SiC components in response to excess current or heat.

As the SiC technology matures, these arrays of smaller SiC devices may be replaced by a single device, transparently in this packaging technology. This technology addresses present issues and transparently addresses the enhancements in the technology that hopefully will be made in the future.

Figure 18:
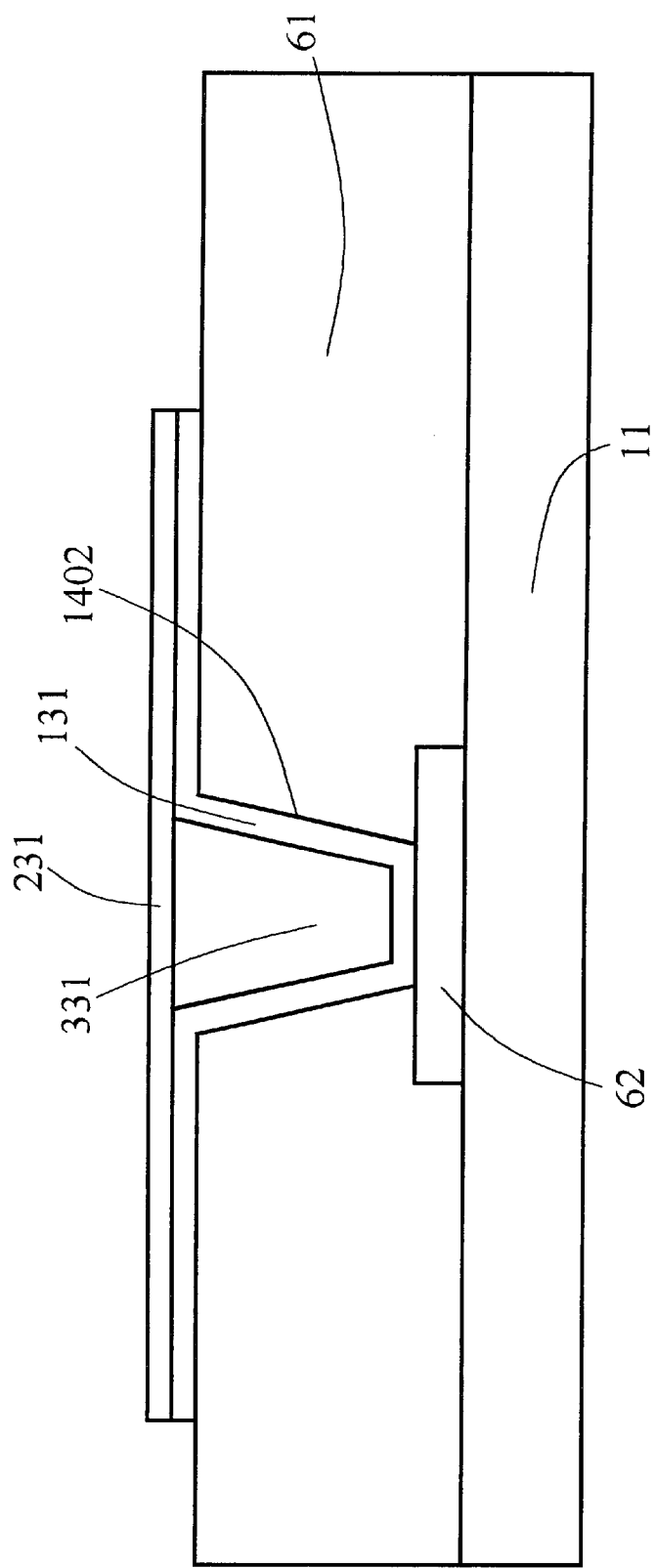
FIG. 18 is a plan view illustrating a via connection embodiment useful in the embodiment of FIG. 17.

FIG. 18 is a plan view illustrating a via connection embodiment useful in the embodiment of FIG. 17. In the embodiment of FIG. 18, current balancing resistive metal 131 (which may comprise NiCr or RTD material) is applied to the surface of polymer layer 61 and via hole 1402. Adjusting the aspect ration and/or the thickness of polymer layer 61 can be useful in regulating the resulting resistance. Additional polymer material 331 (comprising a photoresist, for example) is then provided in via hole 1402, and interconnect metal 231 is applied and patterned over resistive metal 131 and polymer material 331. Polymer material 331 may remain in via hole 1402, or, if interconnect 231 has an opening patterned therein, polymer material 331 may preferably be removed at the same time that polymer layer 61 is removed. Thus, in this embodiment, a resistor is formed without the notches described with respect to FIGS. 3–5. This efficient spacing technique is especially beneficial in embodiments where multiple diffusions are tightly situated.

While only certain preferred features of the invention have been illustrated and described, many modifications, changes and substitutions will occur to those skilled in the art. It is, therefore, to be understood that the appended claims are intended to cover all such modifications and changes as fall within the true spirit of the invention.

What is claimed is:

1. A method for interconnecting high-temperature silicon carbide (SiC) devices on a substrate, comprising:

empirically measuring operational characteristics of the devices;

characterizing operational characteristics of the devices in an operational characteristics map, the operational characteristics map including identification of non-working devices and working devices;

using the operational characteristics map to design interconnection paths for interconnecting the working devices and excluding the non-working devices;

disposing a temporary polymer layer over the devices;

forming via holes through the temporary polymer layer to bonding pads of the devices;

applying a current-balancing resistive metal over the temporary polymer layer in accordance with the designed interconnection paths;

establishing via connections between the current-balancing resistive metal and the bonding pads;

applying a high-temperature shunt metal over the current-balancing resistive metal in accordance with the designed interconnection paths;

removing selected portions of the shunt metal to create notches in the shunt metal for altering electrical resistances in accordance with the designed interconnection paths; and removing the temporary polymer layer.

2. The method of claim 1, wherein the operational characteristics map further includes information regarding current flow for a given voltage through each of the working devices; and wherein using the operational characteristics map to design the interconnection paths includes designing the interconnection paths to balance current flow through each of the working devices.

3. The method of claim 1, wherein the operational characteristics map further includes information regarding heat output of each of the working devices; and wherein using the operational characteristics map to design the interconnection paths includes designing the interconnection paths to generate a substantially uniform heat distribution over the working devices.

4. The method of claim 1, further comprising positioning resistor temperature devices within selected ones of the notches in accordance with the designed interconnection paths.

5. The method of claim 1, wherein applying the current-balancing resistive metal and removing selected portions of the shunt metal to create notches result in forming fuse links in the current-balancing resistive metal underlying at least some of the notches.

6. The method of claim 1, wherein applying the current-balancing resistive metal includes patterning variable widths of the current-balancing resistive metal in accordance with the designed interconnection paths.

7. The method of claim 1, wherein establishing the via connections between the current-balancing resistive metal and the bonding pads comprises extending the current-balancing resistive metal through the via holes to contact the bonding pads.

8. The method of claim 1, wherein establishing the via connections between the current-balancing resistive metal and the bonding pads comprises connecting the current-balancing resistive metal to the bonding pads using die-pad-to-preform connection structures.

9. The method of claim 1, wherein establishing the via connections comprises using braze plugs to form the via connections.

10. The method of claim 1, wherein establishing the via connections comprises using weld straps to form the via connections.

11. The method of claim 1, wherein the current balancing resistive metal comprises a metal preform layer and wherein forming via holes includes using pre-made holes in the preform layer.

12. A method for interconnecting high-temperature silicon carbide (SiC) devices on a substrate, comprising:

empirically measuring operational characteristics of the devices;

characterizing operational characteristics of the devices in an operational characteristics map, the operational characteristics map including identification of non-working devices and working devices;

using the operational characteristics map to design interconnection paths for interconnecting the working devices and excluding the non-working devices;

disposing a temporary polymer layer over the devices;

forming via holes through the temporary polymer layer to bonding pads of the devices;

applying a current-balancing resistive metal over the temporary polymer layers and into the via holes to contact the bonding pads in accordance with the designed interconnection paths;

applying a high-temperature shunt metal over the current-balancing resistive metal in accordance with the designed interconnection paths;

removing selected portions of the shunt metal to create notches in the shunt metal for altering electrical resistances in accordance with the designed interconnection paths; and removing the temporary polymer layer.

13. The method of claim 12, further comprising positioning resistor temperature devices within selected ones of the notches in accordance with the designed interconnection paths.

14. The method of claim 12, wherein applying the current-balancing resistive metal and removing selected portions of the shunt metal to create notches result in forming fuse links in the current-balancing resistive metal underlying at least some of the notches.

15. The method of claim 12, wherein applying the current-balancing resistive metal includes patterning variable widths of the current-balancing resistive metal in accordance with the designed interconnection paths.

16. A method for interconnecting high-temperature silicon carbide (SiC) devices on a substrate, comprising:

empirically measuring operational characteristics of the devices;

characterizing operational characteristics of the devices in an operational characteristics map, the operational characteristics map including identification of non-working devices and working devices;

using the operational characteristics map to design interconnection paths for interconnecting the working devices and excluding the non-working devices;

disposing a temporary polymer layer over the devices;

forming via holes through the temporary polymer layer to bonding pads of the devices;

applying a current-balancing resistive metal on the temporary polymer layer and in the via holes;

filling the via holes with additional polymer material;

applying interconnect metal over the resistive metal and the additional polymer material; and removing the temporary polymer layer.

17. The method of claim 16 further including removing the additional polymer material.

* * * * *